(12) United States Patent
Novak et al.

(10) Patent No.: US 6,818,563 B2
(45) Date of Patent: Nov. 16, 2004

(54) PROCESS AND APPARATUS FOR REMOVAL OF PHOTORESIST FROM SEMICONDUCTOR WAFERS USING SPRAY NOZZLES

(75) Inventors: Richard Novak, Plymouth, MN (US); Ismail Kashkoush, Orefield, PA (US); Gim-Syang Chen, Allentown, PA (US); Dennis Nemeth, Nazareth, PA (US)

(73) Assignee: Akrion LLC, Allentown, PA (US)

( * ) Notice: Subject to any disclaimer, the term of this patent is extended or adjusted under 35 U.S.C. 154(b) by 10 days.

(21) Appl. No.: 10/366,054

(22) Filed: Feb. 13, 2003

(65) Prior Publication Data

US 2003/0136334 A1 Jul. 24, 2003

Related U.S. Application Data

(63) Continuation-in-part of application No. 10/053,371, filed on Jan. 18, 2002, now abandoned.

(51) Int. Cl.[7] .............................................. H01L 21/302
(52) U.S. Cl. ........................................................ 438/710
(58) Field of Search ................................ 438/710, 745; 156/345

(56) References Cited

U.S. PATENT DOCUMENTS

| | | |
|---|---|---|
| 5,776,296 A | 7/1998 | Matthews |
| 5,906,708 A | 5/1999 | Robinson et al. |
| 6,017,827 A | 1/2000 | Morgan |
| 6,103,680 A | 8/2000 | Honda |
| 6,272,768 B1 | 8/2001 | Danese |
| 6,634,368 B1 * | 10/2003 | Jung et al. .................... 134/1.3 |
| 6,645,874 B1 * | 11/2003 | Torek et al. ................. 438/723 |
| 6,666,928 B2 * | 12/2003 | Worm .......................... 134/33 |
| 6,701,941 B1 * | 3/2004 | Bergman et al. ........... 134/25.4 |
| 6,706,641 B2 * | 3/2004 | Worm et al. ................. 438/745 |

* cited by examiner

Primary Examiner—John F. Niebling
Assistant Examiner—Olivia T. Luk
(74) Attorney, Agent, or Firm—Michael B. Fein, Esq.; Brian L. Belles, Esq.; Cozen O'Connor, P.C.

(57) ABSTRACT

A process for removing photoresist from semiconductor wafers is disclosed wherein at least one semiconductor wafer having at least one layer of photoresist is positioned in a process tank; ozone gas is provided to said process tank; and said semiconductor wafer is spayed with a mixture of ozone and deionized water via at least one nozzle. The temperature during the process is maintained at or above ambient temperature. The ozone gas supplied to the tank is preferably under pressure within said process tank and the nozzles preferably spray the mixture of deionized water and ozone at a nozzle pressure between 5 and 10 atmospheres. In another embodiment, the invention is an apparatus for carrying out the process.

26 Claims, 3 Drawing Sheets

PROCESS AND APPARATUS FOR REMOVAL OF PHOTORESIST FROM SEMICONDUCTOR WAFERS USING SPRAY NOZZLES

CROSS-REFERENCE TO RELATED APPLICATION

This application is continuation-in-part to U.S. patent application Ser. No. 10/053,371, filed Jan. 18, 2002 now abandoned.

TECHNICAL FIELD OF THE INVENTION

This invention relates generally to methods and apparatus for removing photoresist from the surfaces of substrates, and specifically to methods and apparatus for removing photoresist from silicon semiconductor wafers using ozonated deionized water.

BACKGROUND ART

The need for quick and efficient removal of photoresist is critical in the area of semiconductor manufacturing. In order to produce a useful semiconductor wafer, first a silicon crystal is grown, sliced into thin wafers, and exposed to a photoresist which forms a layer on the wafers. Multiple layers of photoresist can be formed on the surface of the wafers and then etched off to form patterns on the wafers.

The use of $DIO_3$, which is a mixture of chilled distilled water (DI) and ozone ($O_3$), to remove photoresist from surfaces of a silicon wafer has been taught by Matthews in U.S. Pat. No. 5,776,296. Matthews discloses a process and an apparatus for removing photoresist from a semiconductor wafer using $DIO_3$ at sub-ambient temperatures of 1 to 15° C. wherein the ozone is introduced into the process tank with "a composite element having a permeable member and a nonpermeable member, the permeable member having a top portion and a bottom portion, a means defining an open space in a center portion of the permeable member, and a means defining a trench positioned on the top portion of the permeable member between an outer periphery of the permeable member and the means defining an open space." The Matthews system suffers from certain disadvantages in photoresist removal.

Specifically, requiring that the $DIO_3$ be at a sub-ambient temperature necessitates the use of a chiller, which can be expensive and occupy valuable space in manufacturing clean rooms. Additionally, the Matthews system and methods are not optimal with respect to the speed, efficiency, and effectiveness.

Another method of photoresist stripping is taught by Honda et al in U.S. Pat. No. 6,103,680. Honda teaches applying ozonated water to a semiconductor wafer through the use of a spray rinse to strip photoresist from the wafer. However, the strip rates achieved by merely spraying the wafers with ozonated water are less than optimal with respect to the speed, efficiency, and effectiveness. Thus, a need exists to improve this stripping process.

It is an object of the present invention to provide an improved process of removal of photoresist from semiconductor wafers during the manufacture thereof. Another object is to provide a process and system at high rates and efficiency.

DISCLOSURE OF THE INVENTION

These objects, and others which will become apparant from the following disclosure and the accompanying drawings, are achieved by the present invention which in one aspect is a method of removing photoresist from silicon wafers comprising: positioning at least one semiconductor wafer having at least one layer of photoresist in a process tank; providing ozone gas to said process tank; and spraying said semiconductor wafer with a mixture of ozone and deionized water ($DIO_3$) via at least one nozzle.

Preferably, the ozone gas in the process tank will be under pressure as the semiconductor wafers are being sprayed with the $DIO_3$. This pressure can be between 1 to 3 atmospheres. Also preferably, the nozzles should be high pressure nozzles. The $DIO_3$ can then be sprayed at a nozzle pressure between 1 to 10 atmospheres from said nozzles, preferably between 5 to 10 atmospheres.

The process can also include keeping the temperature in the processing tank at or above ambient temperature. In one embodiment, the temperature is kept between 20–50° C. The process can further include the step of recirculating the $DIO_3$ back into said process tank via said nozzle. When recirculation is used, additional ozone should be added to the $DIO_3$ during recirculation thereby keeping the concentration of ozone in said mixture about constant. This mixture of deionized water and ozone can then be agitated via at least one nozzle. Also, the mixture of deionized water and ozone can be sprayed as a vapor into said process tank or can be sprayed into said process tank as droplets.

In another aspect, the invention is an apparatus for the removal of photoresist from semiconductor wafers, comprising: a process tank capable of holding at least one semiconductor wafer; at least one nozzle set within said tank, said nozzle adapted to spray a mixture of deionized water and ozone onto said wafer; and a source of ozone connected to said process tank.

Preferably, the apparatus will further comprise a means to pressurize said process tank and a means for recirculating said mixture of deionized water and ozone back to said nozzle. The recirculation means should comprise a filter so that photoresist that is stripped off the wafers is not reapplied by the nozzles. Additionally, the means for recirculating can be connected to the source of ozone so that the concentration of ozone in the mixture being applied to the wafers via the nozzles is approximately constant.

It is further referable that the nozzles be high pressure nozzles capable of spraying said mixture of deionized water and ozone at a pressure between 1 and 10 atmospheres. The apparatus should further comprise a means for temperature control adapted to maintain temperature in said process tank between above 20–50° C.

The apparatus can further comprise an ozonator in fluid connection with said nozzle. The source of ozone can be an ozone generator and the nozzle is preferably at or near the top of the process tank.

Preferably a pressure plenum set in excess of one atmosphere, a temperature control system, an ozonator, a filter connected to the tank, and a recirculating pump are included. It is further preferred that the temperature controller is set to maintain the liquid temperature at 20–21° C. or higher.

The $DIO_3$ water mixture can be exposed to the photoresist in the form of a fog and/or tiny droplets of water. The concentration level of the gaseous and dissolved ozone can be monitored using inline ozone analyzers.

Agitation of the $DIO_3$ water on the photoresist layers raises the rate of photoresist removal, i.e., the "strip rate" for photoresist treated with $DIO_3$ water is linked to the velocity rate of the $DIO_3$ water. Notably, an increase in the fluid velocity reduces the boundary layer thickness, thereby resulting in a higher rate of $O_3$ oxidizing the photoresist (also known as "the etching rate"). Fluid velocity of the mixture coming from the nozzles increases with nozzle pressure. In addition, the use of sonic energy also reduces the boundary layer thickness, again resulting in a higher rate of $O_3$ oxidizing the photoresist or etch rate. Thus, the higher the kinetic energy and $O_3$ concentration, the shorter the strip time.

DETAILED DESCRIPTION OF THE INVENTION

Inasmuch as the etch rate of photoresist utilizing a solution of $O_3$ in DI water increases linearly with the increase in $O_3$ concentration, the object of the present invention is to provide a method which significantly increases the $O_3$ concentration in a DI water solution from the methods currently available. In addition, the series of nozzles seek to increase the velocity rate of the $DIO_3$ water so as to reduce the boundary layer thickness and therefore increase the rate of etching. The increase in velocity rate of the $DIO_3$ water coming out of the nozzles is a function of nozzle pressure. The higher the nozzle pressure, the higher the velocity. Additionally, the $O_3$ concentration in the $DIO_3$ water can be increased by providing a pressurized ozone gas atmosphere in the process tank as the nozzles spray the wafers with the $DIO_3$ water. By providing an ozone gas atmosphere within the tank and under pressure, the $O_3$ more readily diffuses into the $DIO_3$ water as it being sprayed from the nozzles and contacting the wafers. The increase in diffusion increases the $O_3$ concentration, thus increasing strip rates.

In processing semiconductor wafers, the wafers are often transported and processed in cassettes that can hold a plurality of wafers. In the present invention, semiconductor wafers having a layer or multi-layers of photoresist are exposed to pressurized $DIO_3$ water at ambient temperature and with a velocity produced by a series of nozzles. The process tank is pressurized and/or contains an ozone gas atmosphere when the wafers are positioned therein for processing. This results in an etching or removal of the photoresist at a higher rate than previously known.

Figure 1:
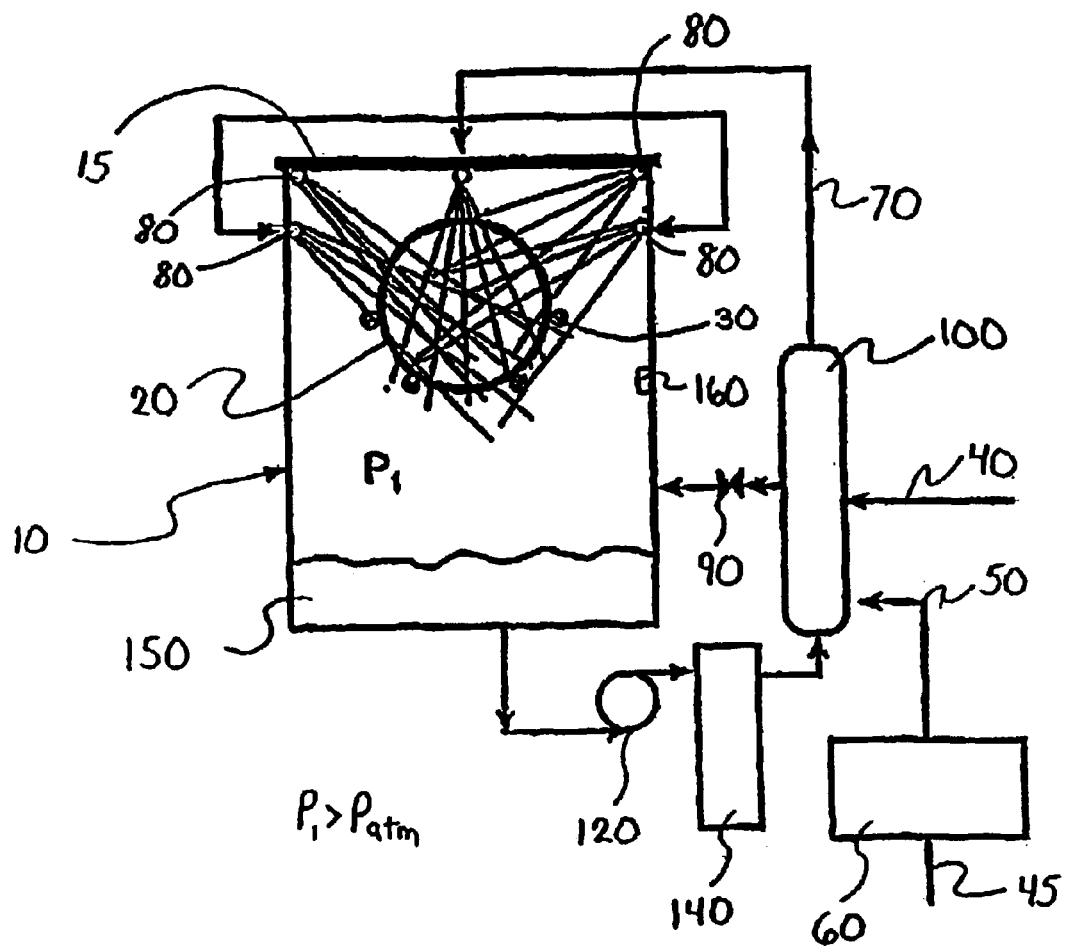
FIG. 1 is a schematic of an embodiment of a photoresist stripping apparatus according to the present invention.

Referring to FIG. 1, the illustrated photoresist removal apparatus includes a process tank 10 which holds semiconductor wafers 20 in a cassette 30. The semiconductor wafers 20 have a layer or multiple layers of photoresist baked onto them. The semiconductor wafers 20 are first loaded into cassette 30. Loaded cassette 30 is then positioned within process tank 10. As illustrated, wafers 20 are in a substantially vertical position and are spaced so that the photoresist can be removed as quickly and completely as possible. Alternatively, cassette 30 does not have to be used and wafers 20 can be positioned and supported in process tank 10 in any acceptable manner. Moreover, the present invention is applicable to single wafer processing methods and apparatus.

Once wafers 20 are positioned in process tank 10, lid 15 is closed. The semiconductor wafers 20 are exposed to $DIO_3$ water 70 through spray nozzles 80. Process tank 20 and $DIO_3$ water 70 is maintained or above ambient temperature. The temperature can range from 20–50° C.

$DIO_3$ water 70 is produced in the following manner. First, oxygen ($O_2$) 45 is fed into ozone generator 60. Ozone generator 60 converts oxygen 45 into pure ozone gas 50 using conventional methods. Pure ozone gas then feeds into ozonator 100 where it can take one of two routes: (1) pure ozone gas 50 can pass directly into process tank 10 by passing through 03 pressure plenum 90; or (2) pure ozone gas 50 will be combined with deionized water 40 by ozonator 100, thus forming $DIO_3$ water 70 which is then fed into process tank 10 via nozzles 80.

In performing a photoresist stripping process according to one embodiment of the present invention, pure ozone gas 50 is first produced in ozone generator 60 as described above. This pure ozone gas 50 flows into ozonator 100. A portion of this pure ozone gas 50 is allowed to flow directly into process tank 10 through 03 pressure plenum 90 until a pressurized ozone gas atmosphere is created in process tank 10 at a desired pressure between 1 to 3 atmospheres.

Ozonator 100 also combines a portion of incoming pure ozone gas 50 with incoming deionized water 40, thus forming $DIO_3$ water 70 to be pumped into process tank 10 via multiple nozzles 80. The multiple nozzles 80 thus produce a $DIO_3$ fog wherein the $DIO_3$ fog interacts with the photoresist on the semiconductor wafers 20. Alternatively, nozzles 80 can be adjusted to spray $DIO_3$ water 70 over wafers 70 as droplets. The multiple nozzles 80 can produce $DIO_3$ droplets varying in diameter which then interact with the photoresist on the semiconductor wafers 20. The droplet size of the sprayed deionized_water will range from a few microns in the fogging stage to a few millimeters in size once collected on the semiconductor wafers 20.

The level of ozone in the $DIO_3$ water 70 is kept in constant through regulation of a first $O_3$ gas sensor located downstream of ozonator 100 but before nozzles 80. If the ozone level is high enough, the pure ozone gas 50 is allowed to pass directly into process tank 10 through $O_3$ pressure plenum 90. On the other hand, if the ozone level is too low, the ozone gas 50 is combined with deionized water 40 in ozonator 100 where more ozone is added until it reaches the proper level, at which time the $DIO_3$ water 70 passes into the process tank 10.

Upon condensation of the $DIO_3$ water 70 as droplets upon the semiconductor wafers 20 the $DIO_3$ water 40 is collected in the bottom of the process tank 10 as liquid 150. The $DIO_3$ liquid 150 is recirculated through process tank 10 by flowing the $DIO_3$ liquid 150 from the process tank 10, into pump 120, through filter 140, and back through ozonator 100 for introduction back into tank 10 via nozzles 80.

Before recirculated $DIO_3$ liquid 150 passes into ozonator 100, it passes through a second dissolved $O_3$ gas sensor (not illustrated) which measures the concentration of $O_3$ present in the recirculated $DIO_3$ liquid 150. If the $O_3$ concentration level is too low, a signal is sent to ozonator 100 to add more pure ozone gas 50 to the recirculated liquid 150 as it passes therethrough.

As mentioned above the pressure in the process tank 10 is maintained at or above the atmospheric pressure to help maintain a high ozone concentration in the $DIO_3$ water 70 contacting wafers 20, thus enhancing the stripping rate. Further, since the process tank 10 is kept pressurized the temperature within the process tank 10 is increased above ambient temperature, preferably process tank 10 is maintained between 20 and 50 degrees Celsius through the use of temperature sensor 160 which will be operably connected to a source of heat and a properly programmed processor. Alternatively, the temperature sensor can be operably connected to measure (and adjust if necessary) the temperature of $DIO_3$ water 70 prior to being sprayed by nozzles 80.

Figure 2:
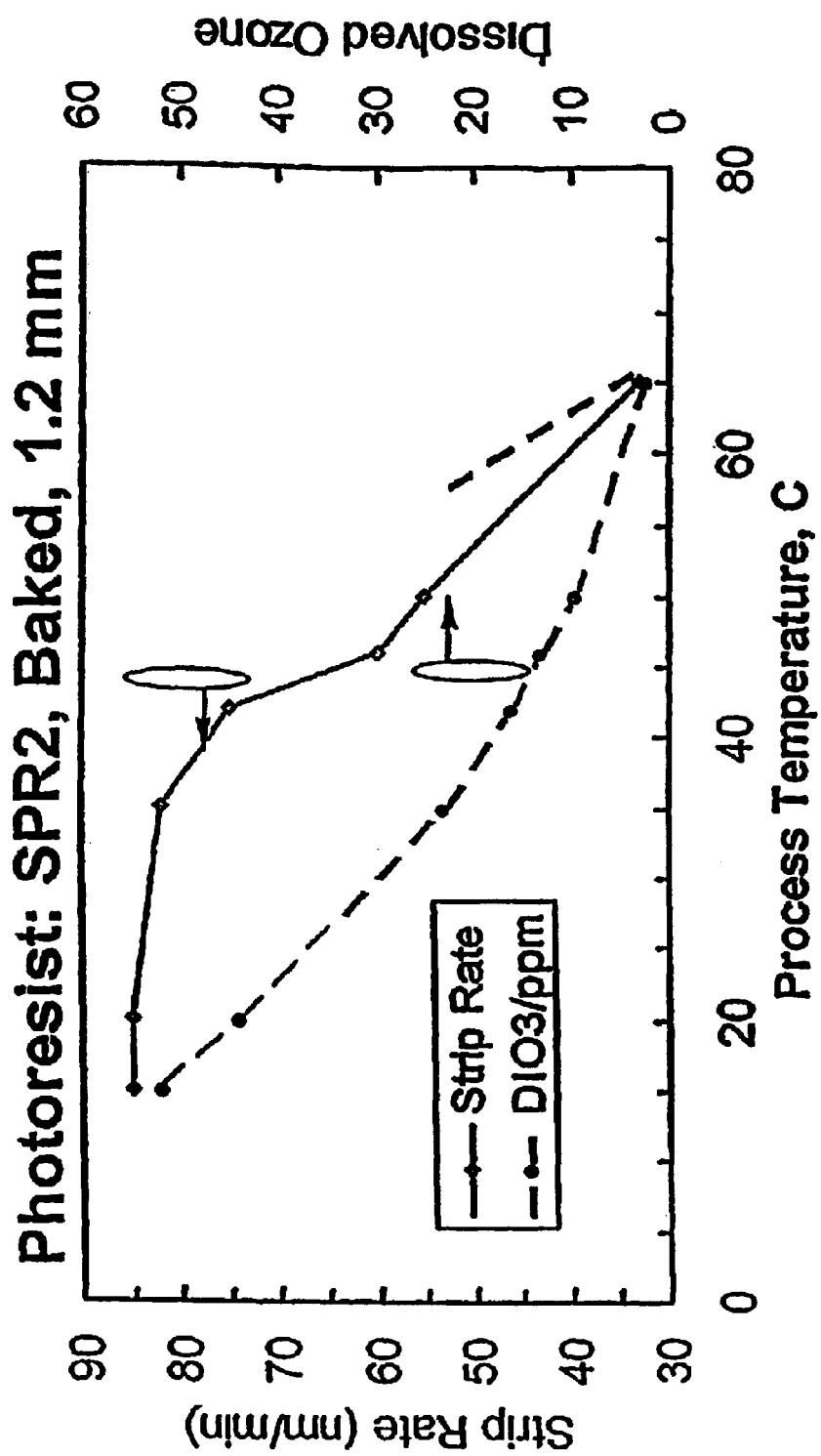
FIG. 2 is a chart of the rate of etching of the photoresist versus the ambient temperature.

Referring now to FIG. 2, the rate relationship between the ambient temperature and concentration of ozone in the $DIO_3$ water 70 indicates that a process time of 15–25 minutes can be used to strip about 15000 Angstrom of positive hard baked photoresist at ambient temperature. The photoresist strip rate depends on the dissolved $O_3$ concentration and average fluid velocity.

Figure 3:
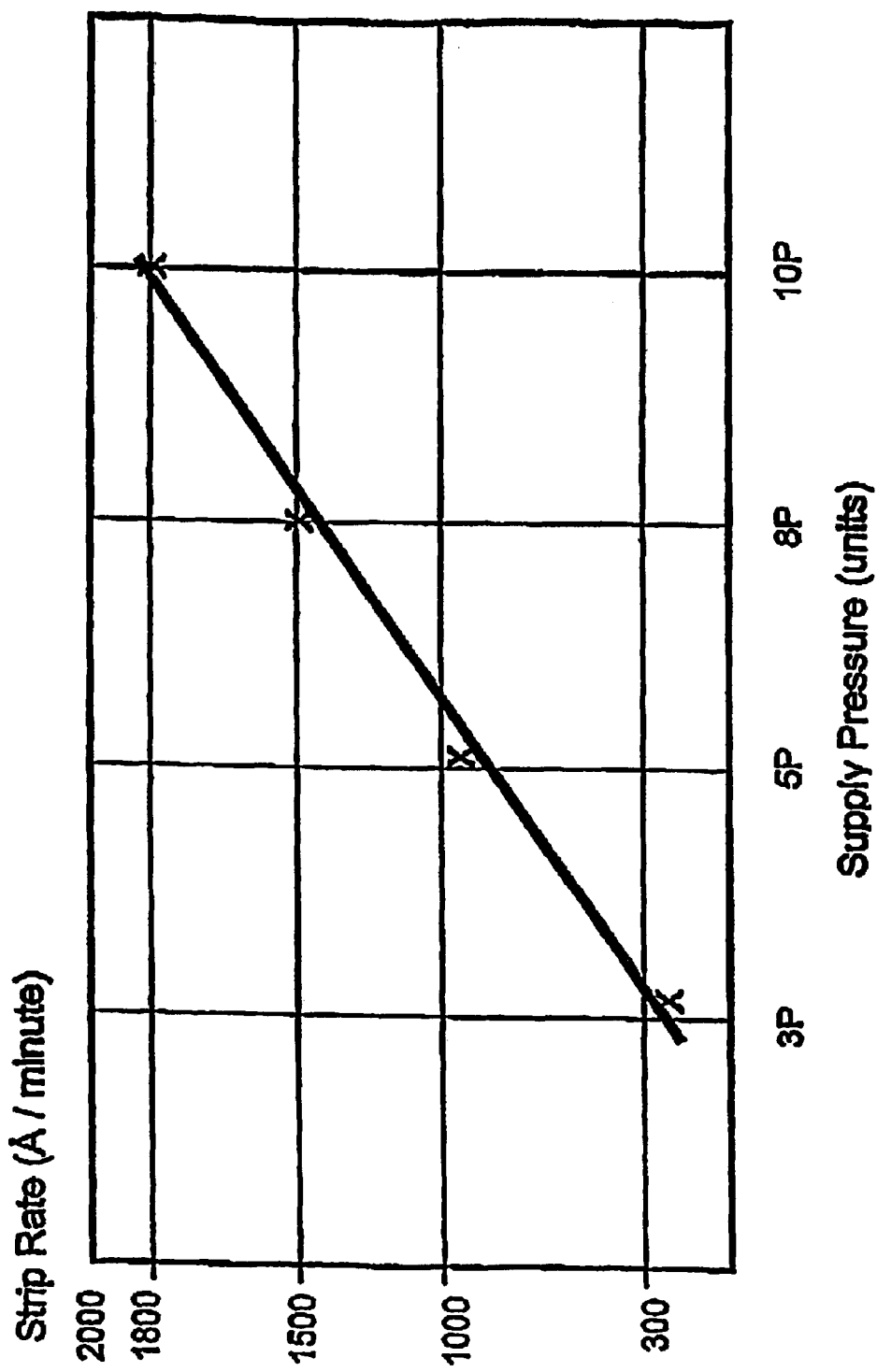
FIG. 3 is a chart of the rate of etching of the photoresist versus the nozzle supply pressure of $DIO_3$ water.

Referring now to FIG. 3, which presents experimental data showing the relationship between the etching rate and the velocity of $DIO_3$ water 40, the higher the kinetic energy (from the fluid velocities) and ozone concentration, the shorter the strip time. By increasing the fluid velocity and turbulence intensity, ozone is introduced to the wafer surface and penetrates the boundary layer. The series of nozzles play a significant role to reduce the process time significantly when optimized. The removal rate has shown to depend on the fluid velocity, turbulence intensity, and ozone concentration. As mentioned earlier, as the nozzle pressure of nozzles 80 is increased, the fluid velocity also increases. It has been fond that a nozzle pressure of 1 to 10 atmospheres is acceptable, with a nozzle pressure of 5–10 atmospheres being preferable.

The nozzle pressure of the $DIO_3$ water directly affects the $O_3$ concentration on the boundary layer and correspondingly affects the etch rate. In summary, the etch rate is affected by the $O_3$ concentration in the DI water which is in turn affected by the temperature and pressure of the $DIO_3$ water. Further, the etch rate is directly affected by the velocity rate of the $DIO_3$ water.

Various modifications and alterations of this invention will become apparent to those skilled in the art without departing from the scope and spirit of this invention, and it should be understood that this invention is not limited to the illustrative embodiments set forth herein.

What is claimed is:

1. A process for removing photoresist from semiconductor wafers comprising:
   positioning at least one semiconductor wafer having at least one layer of photoresist in a process tank;
   providing ozone gas to said process tank to create a gaseous atmosphere comprising said ozone gas; and
   spraying said semiconductor wafer with a mixture of ozone and deionized water via at least one nozzle while said semiconductor wafer is in said gaseous atmosphere.

2. The process according to claim 1 wherein said gaseous atmosphere is under pressure in said process tank.

3. The process according to claim 2 wherein said pressure is between 1 to 3 atmospheres.

4. The process according to claim 1 wherein said mixture of ozone and deionized water is sprayed at a nozzle pressure between 1 to 10 atmospheres from said nozzle.

5. The process according to claim 4 wherein said nozzle pressure is between 5 to 10 atmospheres.

6. The process according to claim 1 further comprising the step of keeping the temperature in the processing tank at or above ambient temperature.

7. The process according to claim 6 wherein the temperature is kept between 20–50° C.

8. A process for removing photoresist from semiconductor wafers comprising:
   positioning at least one semiconductor wafer having at least one layer of photoresist in a process tank;
   providing ozone gas to said process tank;
   spraying said semiconductor wafer with a mixture of ozone and deionized water via at least one nozzle; and
   recirculating said mixture of ozone and deionized water back into said process tank via said nozzle.

9. The process according to claim 8 further comprising adding additional ozone to said mixture of ozone and deionized water during recirculation thereby keeping the concentration of ozone in said mixture about constant.

10. The process according to claim 9 wherein said mixture of deionized water and ozone is agitated via at least one nozzle.

11. A process for removing photoresist from semiconductor wafers comprising:
    positioning at least one semiconductor wafer having at least one layer of photoresist in a process tank;
    providing ozone gas to said process tank; and
    spraying said semiconductor wafer with a mixture of ozone and deionized water via at least one nozzle, where said mixture of deionized water and ozone is sprayed as a vapor into said process tank.

12. The process according to claim 1 wherein said mixture of deionized water and ozone is sprayed into said process tank as droplets.

13. An apparatus for the removal of photoresist from semiconductor wafers, comprising:
    a process tank capable of holding at least one semiconductor wafer;
    at least one nozzle set within said tank, said nozzle adapted to spray a mixture of deionized water and ozone onto said wafer; and
    a source of ozone connected to said process tank and adapted to provide ozone gas to said process tank so as to form a gaseous atmosphere comprising said ozone gas in said process tank while said nozzle sprays said mixture onto said wafer.

14. The apparatus according to claim 13 further comprising means to pressurize said process tank.

15. An apparatus for the removal of photoresist from semiconductor wafers comprising:
    a process tank capable of holding at least one semiconductor wafer;
    at least one nozzle set within said tank, said nozzle adapted to spray a mixture of deionized water and ozone onto said wafer;
    a source of ozone connected to said process tank; and
    means for recirculating said mixture of deionized water and ozone back to said nozzle.

16. The apparatus according to claim 15 further comprising a filter connected to said recirculation means.

17. The apparatus according to claim 15 wherein said means for recirculating is connected to said source of ozone.

18. The apparatus according to claim 13 wherein said nozzle is adapted to spray said mixture of deionized water and ozone at a nozzle pressure between 1 and 10 atmospheres.

19. An apparatus for the removal of photoresist from semiconductor wafers comprising:
    a process tank capable of holding at least one semiconductor wafer;
    at least one nozzle set within said tank, said nozzle adapted to spray a mixture of deionized water and ozone onto said wafer;
    a source of ozone connected to said process tank; and
    a means for temperature control.

20. The apparatus according to claim 19 wherein said means for temperature control is adapted to maintain temperature in said process tank between above 20–50° C.

21. The apparatus according to claim 13 further comprising an ozonator in fluid connection with said nozzle.

22. The apparatus according to claim 13 wherein said source of ozone is an ozone generator.

23. The apparatus according to claim 13 wherein said nozzle is at the top of said process tank.

24. A process for removing photoresist from semiconductor wafer comprising:

creating a gaseous atmosphere comprising ozone gas in a process tank;

supporting at least one semiconductor wafer in said gaseous atmosphere; and contacting said semiconductor wafer with a mixture of ozone and deionized water while said semiconductor wafer is in said gaseous atmosphere.

25. The process of claim 24 wherein said gaseous atmosphere is under pressure.

26. The process of claim 25 wherein said pressure is between 1 to 3 atmospheres.

* * * * *